(12) United States Patent
Metz et al.

(10) Patent No.: US 11,476,338 B2
(45) Date of Patent: *Oct. 18, 2022

(54) ALUMINUM INDIUM PHOSPHIDE SUBFIN GERMANIUM CHANNEL TRANSISTORS

(71) Applicant: Intel Corporation, Santa Clara, CA (US)

(72) Inventors: Matthew V. Metz, Portland, OR (US); Willy Rachmady, Beaverton, OR (US); Harold W. Kennel, Portland, OR (US); Van H. Le, Portland, OR (US); Benjamin Chu-Kung, Hillsboro, OR (US); Jack T. Kavalieros, Portland, OR (US); Gilbert Dewey, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 162 days.

This patent is subject to a terminal disclaimer.

(21) Appl. No.: 16/914,052

(22) Filed: Jun. 26, 2020

(65) Prior Publication Data

US 2020/0328278 A1    Oct. 15, 2020

Related U.S. Application Data

(63) Continuation of application No. 15/752,209, filed as application No. PCT/US2015/049634 on Sep. 11, 2015, now Pat. No. 10,734,488.

(51) Int. Cl.
*H01L 29/267* (2006.01)
*H01L 21/8238* (2006.01)
(Continued)

(52) U.S. Cl.
CPC .... *H01L 29/267* (2013.01); *H01L 21/823821* (2013.01); *H01L 27/0924* (2013.01);
(Continued)

(58) Field of Classification Search
CPC ......... H01L 21/823821; H01L 27/0924; H01L 27/1104; H01L 29/1054; H01L 29/267; H01L 29/66795; H01L 29/7851
See application file for complete search history.

(56) References Cited

U.S. PATENT DOCUMENTS 6,924,517 B2    8/2005   Chen et al.
8,313,999 B2    11/2012  Cappellani et al.
(Continued)

FOREIGN PATENT DOCUMENTS

CN    1591899       3/2005
CN    101017823     8/2007
(Continued)

OTHER PUBLICATIONS

Notice of Allowance from Chinese Patent Application No. 201580082343.X dated Dec. 23, 2020, 3 pgs.
(Continued)

*Primary Examiner* — Allan R Wilson
(74) *Attorney, Agent, or Firm* — Essential Patents Group, LLP

(57) ABSTRACT

Embodiments related to transistors and integrated circuits having aluminum indium phosphide subfins and germanium channels, systems incorporating such transistors, and methods for forming them are discussed.

20 Claims, 9 Drawing Sheets

(51) Int. Cl.
   *H01L 27/092* (2006.01)
   *H01L 27/11* (2006.01)
   *H01L 29/10* (2006.01)
   *H01L 29/66* (2006.01)
   *H01L 29/78* (2006.01)

(52) U.S. Cl.
   CPC ...... *H01L 27/1104* (2013.01); *H01L 29/1054* (2013.01); *H01L 29/66795* (2013.01); *H01L 29/7851* (2013.01)

(56) References Cited

U.S. PATENT DOCUMENTS

| | | |
|---|---|---|
| 8,648,400 B2 | 2/2014 | Xu |
| 8,815,691 B2 | 8/2014 | Colinge et al. |
| 8,946,908 B2 | 2/2015 | Holmes et al. |
| 9,059,024 B2 | 6/2015 | Glass et al. |
| 9,099,519 B2 | 8/2015 | Shen et al. |
| 9,165,837 B1 | 10/2015 | Fronheiser et al. |
| 9,171,925 B2 | 10/2015 | Kuo et al. |
| 9,190,466 B2 | 11/2015 | Yeh et al. |
| 9,196,548 B2 | 11/2015 | Hashed et al. |
| 9,287,404 B2 | 3/2016 | Poelzl et al. |
| 9,455,199 B1 | 9/2016 | Jacob |
| 9,564,435 B2 | 2/2017 | Chung et al. |
| 9,728,464 B2 | 8/2017 | Glass et al. |
| 9,882,009 B2 | 1/2018 | Glass et al. |
| 9,953,885 B2 | 4/2018 | Yuan et al. |
| 9,991,262 B1 | 6/2018 | Ching et al. |
| 10,056,380 B2 | 8/2018 | Ghani et al. |
| 10,446,685 B2 | 10/2019 | Mohapatra et al. |
| 2005/0191795 A1 | 9/2005 | Chidambarrao et al. |
| 2006/0197129 A1 | 9/2006 | Wohlmuth |
| 2007/0001173 A1 | 1/2007 | Brask et al. |
| 2008/0073667 A1 | 3/2008 | Lochtefeld |
| 2011/0014792 A1 | 1/2011 | Kim |
| 2012/0231596 A1 | 9/2012 | Majhi et al. |
| 2013/0001591 A1 | 1/2013 | Wu et al. |
| 2013/0049068 A1 | 2/2013 | Lin et al. |
| 2013/0175627 A1 | 7/2013 | Goldbach et al. |
| 2013/0228875 A1 | 9/2013 | Lee et al. |
| 2013/0234204 A1 | 9/2013 | Kang et al. |
| 2013/0270612 A1 | 10/2013 | Chien et al. |
| 2013/0313619 A1 | 11/2013 | Fumitake |
| 2014/0054646 A1 | 2/2014 | Vellianitis |
| 2014/0284726 A1 | 9/2014 | Lee et al. |
| 2015/0048454 A1 | 2/2015 | Colinge et al. |
| 2015/0102392 A1 | 4/2015 | Yu et al. |
| 2015/0162404 A1 | 6/2015 | Yang et al. |
| 2015/0187773 A1 | 7/2015 | Niimi et al. |
| 2015/0303118 A1 | 10/2015 | Wang et al. |
| 2016/0049402 A1 | 2/2016 | Liu et al. |
| 2016/0099352 A1 | 4/2016 | Lee et al. |
| 2016/0163802 A1* | 6/2016 | Glass .................. H01L 29/165 438/285 |
| 2016/0190319 A1 | 6/2016 | Kavalieros et al. |
| 2016/0211262 A1 | 7/2016 | Jan et al. |
| 2018/0151695 A1 | 5/2018 | Huang et al. |
| 2018/0248028 A1 | 8/2018 | Mohapatra et al. |

FOREIGN PATENT DOCUMENTS

| | | |
|---|---|---|
| CN | 102054741 | 5/2011 |
| CN | 103311306 | 9/2013 |
| CN | 103378156 | 10/2013 |
| CN | 103383965 | 11/2013 |
| CN | 103915325 | 7/2014 |
| CN | 104011870 | 8/2014 |
| CN | 104037088 | 9/2014 |
| CN | 104380443 | 2/2015 |
| CN | 104517856 | 4/2015 |
| CN | 104752507 | 7/2015 |
| CN | 104992979 | 10/2015 |
| EP | 1677350 | 7/2006 |
| TW | 201511277 | 3/2015 |
| TW | 201523875 | 6/2015 |
| WO | 2005098963 | 10/2005 |
| WO | 2014133293 | 9/2014 |
| WO | 2015026371 | 2/2015 |
| WO | 2015047253 | 4/2015 |
| WO | 2015094305 | 6/2015 |
| WO | 2015199705 | 12/2015 |

OTHER PUBLICATIONS

Office Action from Taiwan Patent Application No. 105124235 dated Jul. 13, 2020, 7 pgs.
International Preliminary Report on Patentability from PCT/US2015/049634 dated Mar. 22, 2018, 9 pgs.
International Search Report and Written Opinion from PCT/US2015/049634 dated Feb. 26, 2016, 9 pgs.
Notice of Allowance from U.S. Appl. No. 15/752,209 dated Apr. 10, 2020, 9 pgs.
Office Action from Taiwanese Patent Application No. 105124235 dated Feb. 24, 2020, 36 pgs.
Office Action from Taiwanese Patent Application No. 105124235 dated Nov. 11, 2019, 12 pgs.
Office Action from Chinese Patent Application No. 201580082343.X dated Nov. 6, 2020, 11 pgs.
Notice of Allowance from Taiwanese Patent Application No. 105124235 dated Jan. 10, 2022, 5 pgs.

* cited by examiner

ALUMINUM INDIUM PHOSPHIDE SUBFIN GERMANIUM CHANNEL TRANSISTORS

CLAIM OF PRIORITY

This application is a Continuation of, and claims priority to, U.S. patent application Ser. No. 15/752,209, filed on Feb. 12, 2018 and titled "ALUMINUM INDIUM PHOSPHIDE SUBFIN GERMANIUM CHANNEL TRANSISTORS," which is a National Stage Entry of, and claims priority to, PCT Application No. PCT/US2015/049634, filed on Sep. 11, 2015 and titled "ALUMINUM INDIUM PHOSPHIDE SUBFIN GERMANIUM CHANNEL TRANSISTORS," which are incorporated by reference in their entireties for all purposes.

TECHNICAL FIELD

Embodiments of the invention generally relate to semiconductor transistors with enhanced channel mobility and reduced leakage, and more particularly relate to germanium channel transistors with aluminum indium phosphide subfins and related devices and manufacturing techniques.

BACKGROUND

In some implementations, transistors, such as metal-oxide-semiconductor field-effect transistors (MOSFETs) may by multi-gate devices (e.g., tri-gate transistors, FinFETs or the like). Such structures may offer the advantages of more current flow when the device is on and less current flow when the device is off as compared to similar planar transistor structures, and may thereby provide greater performance and less power usage. For example, multi-gate devices may include a fin or the like such as a silicon fin that is coupled to a source, a drain, and a gate between the source and the drain. The fin may include a channel region adjacent to the gate.

Furthermore, as device improvements are sought, different materials may be implemented for the various components of the multi-gate devices. In particular, the fin or pillar may be made up of materials other than silicon in order to improve device performance. Such materials may provide increased electron and/or hole mobilities or the like to increase drive current, for example. As new materials are provided within the fin structure, the optimization of channel mobility and subfin leakage may be a continuing problem.

As such, existing techniques do not provide for transistor structures with enhanced channel mobility and minimal or reduced leakage such as subfin leakage. Such problems may become critical as devices having increased speed, enhanced drive current, and low power consumption are needed in various applications.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
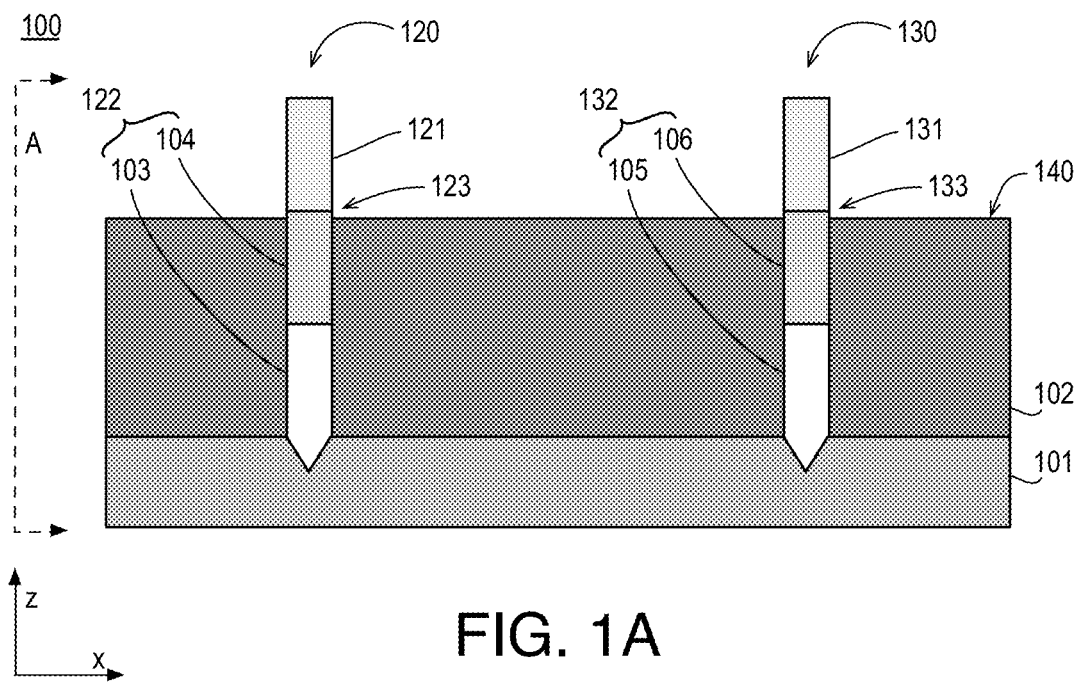
FIG. 1A is a side view of an example integrated circuit including example transistors.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized and structural and/or logical changes may be made without departing from the scope of claimed subject matter. It should also be noted that directions and references, for example, up, down, top, bottom, over, under, and so on, may be used to facilitate the discussion of the drawings and embodiments and are not intended to restrict the application of claimed subject matter. Therefore, the following detailed description is not to be taken in a limiting sense and the scope of claimed subject matter defined by the appended claims and their equivalents.

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "in one embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not specified to be mutually exclusive.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

Transistors, integrated circuits, devices, apparatuses, computing platforms, and methods are described below related to transistors having enhanced channel mobility and reduced leakage.

As described above, it may be advantageous to provide transistors having enhanced channel mobility and minimal or reduced leakage. Such transistors may provide increased drive current and power savings. In an embodiment, a transistor may include a germanium fin channel and a subfin having an aluminum indium phosphide layer adjacent to the germanium fin channel and a second layer adjacent to the aluminum indium phosphide layer. The germanium fin channel may provide a high channel mobility material for the transistor. Furthermore, the aluminum indium phosphide layer of the subfin layer may provide reduced leakage (e.g., subfin leakage) by providing a conduction band offset and/or a valence band offset with respect to the germanium fin channel. Such offsets may provide an energy state barrier for containment of leakage such as subfin (e.g., via the bottom of the fin channel) leakage. For example, the valence band offset (VBO) may provide containment for a PMOS (P-type metal-oxide semiconductor) transistor and the conduction band offset (CBO) may provide containment for an NMOS (N-type metal-oxide semiconductor) transistor.

In an embodiment, the transistor may be an NMOS transistor and the aluminum indium phosphide layer of the subfin may provide a tensile strain to the fin channel. In another embodiment, the transistor may be a PMOS transistor and the aluminum indium phosphide layer of the subfin may provide a compressive strain to the fin channel. For example, a higher aluminum concentration in the aluminum indium phosphide layer may provide a smaller lattice constant in the aluminum indium phosphide layer, which may provide an advantageous compressive strain for a PMOS transistor and a lower aluminum concentration may provide a larger lattice constant and an advantageous tensile strain for an NMOS transistor.

In an embodiment, a CMOS (complimentary metal-oxide semiconductor) circuit may include a PMOS transistor with a fin channel under a compressive strain and an NMOS transistor with a fin channel under a tensile strain by selectively providing aluminum indium phosphide subfin layers of differing aluminum concentrations. In some embodiments, a CMOS circuit may include an NMOS transistor having a germanium fin channel and a subfin having an aluminum indium phosphide layer adjacent to the germanium fin channel and a PMOS transistor having different fin channel and/or subfin materials. For example, the PMOS transistor fin channel may be germanium, silicon, or a III-V material and the subfin layer adjacent to the fin channel may be any suitable material. In other embodiments, a CMOS circuit may include a PMOS transistor having a germanium fin channel and a subfin having an aluminum indium phosphide layer adjacent to the germanium fin channel and an NMOS transistor having different fin channel and/or subfin materials. For example, the NMOS transistor fin channel may be germanium, silicon, or a III-V material and the subfin layer adjacent to the fin channel may be any suitable material. In an embodiment, the NMOS transistor fin channel may be indium gallium arsenide and the subfin layer adjacent to the fin channel may be gallium arsenide.

In an embodiment, an integrated circuit may comprise a transistor including a fin channel that comprises germanium and a subfin with an aluminum indium phosphide layer adjacent to the fin channel and a second layer adjacent to the aluminum indium phosphide layer. Such a transistor may provide high performance and low power with high channel mobility and minimal or reduced subfin leakage. These and additional embodiments are discussed further herein with respect to the figures.

Figure 1B:
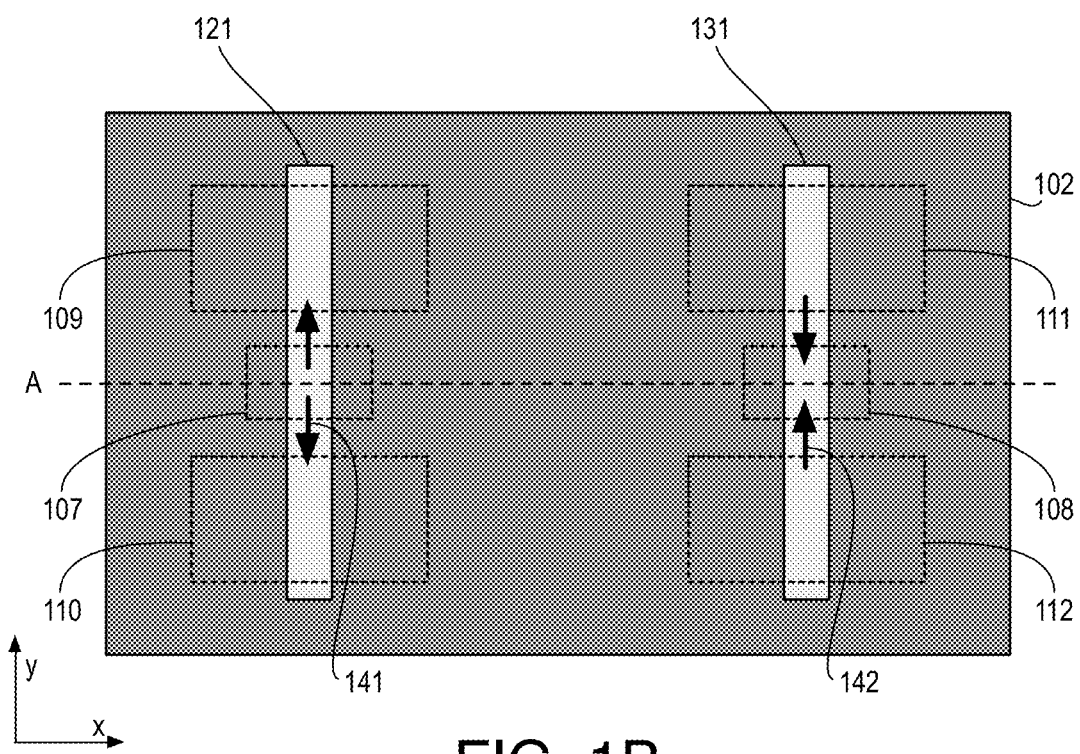
FIG. 1B is a plan view of the example transistors of FIG. 1A.

FIG. 1A is a side view of an example integrated circuit 100 including example transistors 120, 130 and FIG. 1B is a plan view of example transistors 120, 130, arranged in accordance with at least some implementations of the present disclosure. FIG. 1A provides a side view taken along plane A as shown in the plan view of FIG. 1B. In some examples, transistor 120 may be an NMOS transistor and transistor 130 may be a PMOS transistor. Transistors 120, 130 may be characterized as tri-gate transistors, multi-gate transistors, FinFETs, or the like. Transistors 120, 130 may provide for a fin architecture for CMOS circuits that provide high channel mobility and low subfin leakage.

As shown, integrated circuit 100 may include a substrate 101 and a dielectric layer 102. In an embodiment, substrate 101 is silicon (e.g., (100) crystalline silicon). Dielectric layer 102 may include a pattern providing openings or trenches for fins as shown. In an embodiment, dielectric layer 102 is an oxide (e.g., silicon oxide). For example, transistor 120 may include a fin having a fin channel 121 and a subfin 122 including a base layer 103 and a subfin layer 104. Transistor 130 may include a fin having a fin channel 131 and a subfin 132 including a base layer 105 and a subfin layer 106. As used herein, the term fin may include both a fin channel and a subfin. In some embodiments, the subfin may include multiple layers such as a layer adjacent to the fin channel (e.g., a subfin layer) and a second layer adjacent to the subfin layer (e.g., a base layer). In other embodiments, the subfin may include only a subfin layer. Furthermore, as used herein, the term fin channel may include a portion of the fin that at least partially extends above a dielectric layer or the like. Such a fin channel may include a portion that provides a channel in operation and other portions such as portions that provide contact to a source and a drain. As will be appreciated, only a portion of such a fin channel provides a channel in operation and such a channel may be described as a channel region either when the transistor is in operation or not. In some embodiments, such a region of a fin may be characterized as a fin portion, an active fin portion, an exposed fin portion, or the like.

In an embodiment, base layer 103 and/or base layer 105 include or are composed of gallium arsenide such as an epitaxially grown, crystalline, or substantially singular crystalline gallium arsenide. In an embodiment, subfin layer 104 and/or subfin layer 106 include or are composed of an epitaxially grown, crystalline, or substantially singular crystalline aluminum indium phosphide layer. Subfin layers 104, 106 may include any composition of aluminum indium phosphide such as aluminum concentrations in the range of 1% to 99%, indium concentrations in the range of about 1% to 99%, or the like. In an embodiment, fin channel 121 and/or fin channel 131 include or are composed of an epitaxially grown, crystalline, or substantially singular crystalline germanium layer. As is discussed further herein, base layers 103, 105, subfin layers 104, 106, and fin channels 121, 131 may be epitaxially grown within a trench (e.g., a narrow or high aspect ratio trench).

Also as shown in FIG. 1B, transistor 120 may include a gate 107 and transistor 130 may include a gate 108. Gates 107, 108 may provide a charge (e.g., via a gate contact, not shown) to portions of fin channels 121, 131 to induce a channel within fin channels 121, 131 during the operation of transistors 120, 130. For example, gates 107, 108 may be disposed over portions of fin channels 121, 131. Gates 107, 108 are not shown in FIG. 1A and are shown in hatched lines in FIG. 1B for the sake of clarity of presentation.

As shown in FIG. 1B transistor 120 may include a source 109 and a drain 110 coupled to fin channel 121 and transistor 130 may include a source 111 and a drain 112 coupled to fin channel 131. Sources 109, 111 and drains 110, 112 may provide electrical contact to transistors 120, 130 and may include any suitable material or materials. In some embodiments, sources 109, 111 and drains 110, 112 may be formed via a raised source and drain epitaxial growth or regrowth process or via material deposition and patterning processes or the like. Sources 109, 111 and drains 110, 112 are not shown in FIG. 1A and are shown in hatched lines in FIG. 1B for the sake of clarity of presentation.

As discussed, fin channels 121, 131 may include or be composed of germanium such as an epitaxial germanium. In an embodiment, fin channels 121, 131 may provide enhanced or increased electron and hole mobility for fin channels 121, 131 as compared to other channel materials. For example, germanium may provide a low effective mass for both NMOS and PMOS transistors allowing for high mobility and drive currents.

Also as discussed, subfin layers 104, 106 may include or be composed of aluminum indium phosphide such as an epitaxial aluminum indium phosphide. In an embodiment, subfin layers 104, 106 may include or be composed of aluminum indium phosphide having the same compositions. Aluminum indium phosphide subfin layers 104, 106 may provide large band offsets with respect to germanium fin channels 121, 131, which may reduce or eliminate subfin leakage during the operation of transistors 120, 130.

Figure 2:
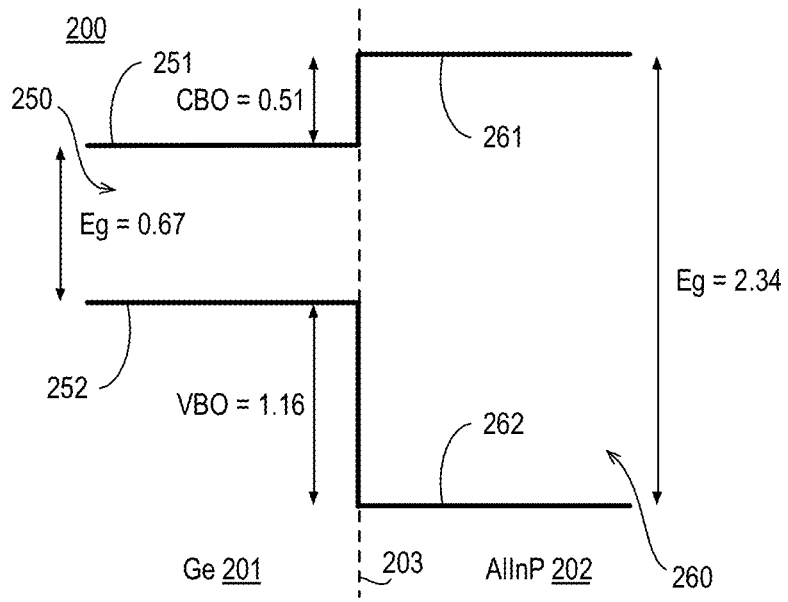
FIG. 2 is an example band diagram of an example hetero-junction between germanium and aluminum indium phosphide.

FIG. 2 is an example band diagram 200 of an example hetero-junction 203 between germanium and aluminum indium phosphide, arranged in accordance with at least some implementations of the present disclosure. As shown in FIG. 2, band diagram 200 may include a germanium band gap 250 having a conduction band edge 251 indicative of a conduction band and a valence band edge 252 indicative of a valence band. For example, germanium band gap 250 may include a narrow band gap associated with a germanium region 201. Also as shown, band diagram 200 may include an aluminum indium phosphide band gap 260 having a conduction band edge 261 indicative of a conduction band and a valence band edge 262 indicative of a valence band. For example, aluminum indium phosphide band gap 260 may include a wide band gap associated with aluminum indium phosphide region 202. As shown, germanium region 201 and aluminum indium phosphide region 202 may meet at hetero-junction 203.

As shown, germanium 201 may provide a narrow band gap material having a gap width (Eg) of about 0.67 eV and aluminum indium phosphide may provide a wide band gap material having a gap width (Eg) of about 2.34 eV. Such a band gap structure across the physical dimension of transistors 120, 130 extending from fin channels 121, 131 downwardly to subfin layers 104, 106 (please refer to FIG. 1A) may provide a high conduction band offset (CBO) and a high valence band offset (VBO) across hetero-junction 203. For example, the CBO may be about 0.51 and the VBO may be about 1.16 as shown in FIG. 2. The provided gap widths, CBO, and VBO are example values and transistors 120, 130 may include any suitable materials as discussed herein.

In the germanium and aluminum indium phosphide system illustrated in FIG. 2, the illustrated conduction band offset may provide minimal, reduced, or negligible transportation for electrons in NMOS transistors. Furthermore, the illustrated valence band offset may provide minimal, reduced, or negligible transportation for holes in PMOS transistors. Therefore, for both NMOS and PMOS transistors, a germanium and aluminum indium phosphide system may provide for high channel mobility (e.g., via germanium fin channels) and minimal, reduced, or negligible subfin leakage (e.g., via the germanium fin channel and aluminum indium phosphide hetero-junction).

Furthermore, the illustrated germanium and aluminum indium phosphide system may provide improved dopant barrier properties at hetero-junction 203 (e.g., between fin channels 121, 131 and subfin layers 104, 106, please refer to FIG. 1A). For example, aluminum content in aluminum indium phosphide region 202 (e.g., in aluminum indium phosphide subfin layers 104, 106) may improve dopant barrier properties by suppressing or reducing intermixing of the germanium of germanium region 201 (e.g., germanium fin channels 121, 131) and aluminum indium phosphide, which, for example, may be dopant species for the opposite layers.

Returning to FIGS. 1A and 1B, in some embodiments, transistor 120 may be an NMOS transistor and transistor 130 may be a PMOS transistor. In some implementations, for example, it may be more difficult to achieve low subfin leakage with respect to an NMOS transistor in germanium and aluminum indium phosphide systems and other material systems such as germanium fin channel systems. In some embodiments, NMOS transistor 120 may include a germanium fin channel 121 and an aluminum indium phosphide subfin layer 104 while PMOS transistor 130 may include a subfin layer 106 and fin channel 131 including other materials. In other embodiments, PMOS transistor 130 may include a germanium fin channel 131 and an aluminum indium phosphide subfin layer 106 while NMOS transistor 120 may include a subfin layer 104 and fin channel 121 including other materials. In an embodiment, NMOS transistor 120 may include a gallium arsenide subfin layer 104 and an indium gallium arsenide fin channel 121.

Furthermore, it may be advantageous to provide stress engineering to fin channels 121, 131 such that fin channel 121 of NMOS transistor 120 is under tensile strain while PMOS transistor 130 is under compressive strain as shown via arrows 141, 142 in FIG. 1B. In some embodiments, NMOS transistor 120 may include an aluminum indium phosphide subfin layer 104 having a composition that may provide a tensile strain to germanium fin channel 121. In some embodiments, PMOS transistor 130 may include subfin layer 104 (e.g., comprising aluminum indium phosphide or another material) having a composition that may provide a compressive strain to germanium fin channel 121.

In an embodiment, NMOS transistor 120 may include a germanium fin channel 121 and an aluminum indium phosphide subfin layer 104. For example, germanium fin channel 121 may be a doped germanium having a lattice constant in the range of about 5.6 to 5.7 Å. The composition of aluminum indium phosphide subfin layer 104 may be selected such that subfin layer 104 has a larger lattice constant with respect to the lattice constant of germanium fin channel 121 and such that a tensile strain may be exerted on germanium fin channel 121. For example, a larger lattice constant aluminum indium phosphide subfin layer 104 may be provided by increasing the concentration of indium and reducing the concentration of aluminum in aluminum indium phosphide subfin layer 104. In some embodiments, the aluminum concentration in an aluminum indium phosphide subfin layer 104 may be in the range of about 35% to 50% such that a tensile strain may be exerted on germanium fin channel 121. As discussed, subfin layer 104 may provide a tensile strain on fin channel 121 of NMOS transistor 120. In some embodiments, the tensile strain may be up to about 1%, although any tensile strain may be provided. In some embodiments, no tensile strain may be provided.

In an embodiment, PMOS transistor 130 may include a germanium fin channel 131 and an aluminum indium phosphide subfin layer 106. For example, germanium fin channel 131 may be a doped germanium having a lattice constant in the range of about 5.6 to 5.7 Å as discussed with respect to fin channel 121. The composition of aluminum indium phosphide subfin layer 106 may be selected such that subfin layer 106 has a smaller lattice constant with respect to the lattice constant of germanium fin channel 121 and such that a compressive strain may be exerted on germanium fin channel 131. For example, a smaller lattice constant aluminum indium phosphide subfin layer 106 may be provided by decreasing the concentration of indium and increasing the concentration of aluminum in aluminum indium phosphide subfin layer 106. In some examples, the aluminum concentration in an aluminum indium phosphide subfin layer 104 may be in the range of about 100% to 50% such that a compressive strain may be exerted on germanium fin channel 131. As discussed, subfin layer 106 may provide a compressive strain on fin channel 131 of PMOS transistor 130. In some embodiments, the compressive strain may be in the range of about 1% to 2% although any compressive strain may be provided. In some embodiments, no compressive strain may be provided.

As discussed, in some embodiments, fin channel 121 of NMOS transistor 120 may be under tensile strain and fin channel 131 of PMOS transistor 130 may be under compressive strain based on the compositions of subfin layers 104, 106. In an embodiment, the aluminum to indium ratio of an aluminum indium phosphide subfin layer 104 may be less than the aluminum to indium ratio of an aluminum indium phosphide subfin layer 106 such that the discussed stress engineering may be attained.

In some embodiments, NMOS transistor 120 may include a gallium arsenide base layer 103, an aluminum indium phosphide subfin layer 104, and a germanium fin channel 121. Furthermore, in some embodiments, PMOS transistor 130 may include a gallium arsenide base layer 103, an aluminum indium phosphide subfin layer 104, and a germanium fin channel 121. In some embodiments, the composition of subfin layers 104, 106 may be different and selected to provide stress engineering and/or fin channels 121, 131 may be doped or the like to provide advantageous properties for transistors 120, 130. In some embodiments, NMOS transistor 120 or PMOS transistor 130 may include different material systems or selections. For example, NMOS transistor 120 or PMOS transistor 130 may include base layers having materials other than gallium arsenide, subfin layers having materials other than aluminum indium phosphide, or fin channels having materials other than germanium. In some embodiments, NMOS transistor 120 may include a gallium arsenide, aluminum indium phosphide, germanium system and PMOS transistor 130 may include a different material system such as a base layer including gallium arsenide, a subfin layer having any material that may decrease sub-fin leakage, and a fin channel including germanium, silicon, a III-V material, or the like. In some embodiments, PMOS transistor 130 may include a gallium arsenide, aluminum indium phosphide, germanium system and NMOS transistor 120 may include a different material system such as a base layer including gallium arsenide, a subfin layer having any material that may decrease sub-fin leakage, and a fin channel including germanium, silicon, a III-V material, or the like. In an embodiment, NMOS transistor 120 may include a base layer including gallium arsenide, a subfin layer including gallium arsenide, and a fin channel including indium gallium arsenide.

In an embodiment, subfin layers 104, 106 may comprise the same compositions. As discussed with respect to FIG. 2, such a material system may provide high barrier offsets for both NMOS and PMOS devices. Furthermore, such a material system may provide for simpler manufacturing process flows. However, such a material system may not allow for independent stress engineering of NMOS and PMOS devices.

As shown in FIG. 1A, in some examples, fin channels 121, 131 may extend above dielectric layer 102 by a portion 123 and a portion 133, respectively. For example, dielectric layer 102 may be adjacent to base layers 103, 105 and adjacent to a portion of subfin layer 104 and a portion of subfin layer 106. Furthermore, base layers 103, 105 and dielectric layer 102 may be on substrate 101 as shown. Subfin layers 104, 106 may have portions 123, 133 that extend beyond a top surface 140 of dielectric layer 102 such that bottom surfaces of fin channels 121, 131 are above dielectric layer 102. Such an arrangement may provide for enhanced control of fin channels 121, 131 via gates 107, 108. For example, if the bottoms of fin channels 121, 131 were below top surface 140 of dielectric layer 102, gates 107, 108 may disadvantageously lose contact area with fin channels 121, 131, which may cause loss of gate control or the like.

Furthermore, sources 109, 111 and drains 110, 112 may include any suitable materials. In some examples, sources 109, 111 and drains 110, 112 may include an epitaxial growth material. In some examples, source 109 and drain 110 and/or source 111 and drain 112 may include or be composed of a different material than fin channels 121, 131.

In some examples, source 109 and drain 110 may include or be composed of the same material or materials as source 111 and drain 112. In other examples, source 109 and drain 110 may include or be composed of different materials as source 111 and drain 112. In some embodiments, sources 109, 111 and drains 110, 112 may include material(s) selected to provide strain engineering to fin channels 121, 131 for improved performance. Furthermore, source 111 and drain 112 may be heavily doped with a p-type dopant and source 109 and drain 110 may be heavily doped with an n-type dopant.

As discussed, gates 107, 108 may be disposed over fin channels 121, 131. Gates 107, 108 may include any suitable material, materials or stack of materials for providing electrical control over channel regions of fin channels 121, 131. In an embodiment, gates 107, 108 include an epitaxial layer of silicon or other suitable material adjacent to channel regions of fin channels 121, 131, a high-k gate dielectric over the epitaxial layer of silicon and a metal gate portion over the high-k gate dielectric. In an embodiment, gates 107, 108 include a high-k gate dielectric adjacent to channel regions of fin channels 121, 131 and a metal gate portion over the high-k gate dielectric.

Additional details associated with the described features of integrated circuit 100 and/or transistors 120, 130 are provided herein with respect to FIGS. 4A-4G and the associated discussion, which provides additional details related to the formation of integrated circuit 100 and transistors 120, 130. Furthermore, integrated circuit 100 may be implemented in an electronic device structure such as a logic device, an SRAM, or the like, as is discussed further herein.

Figure 3:
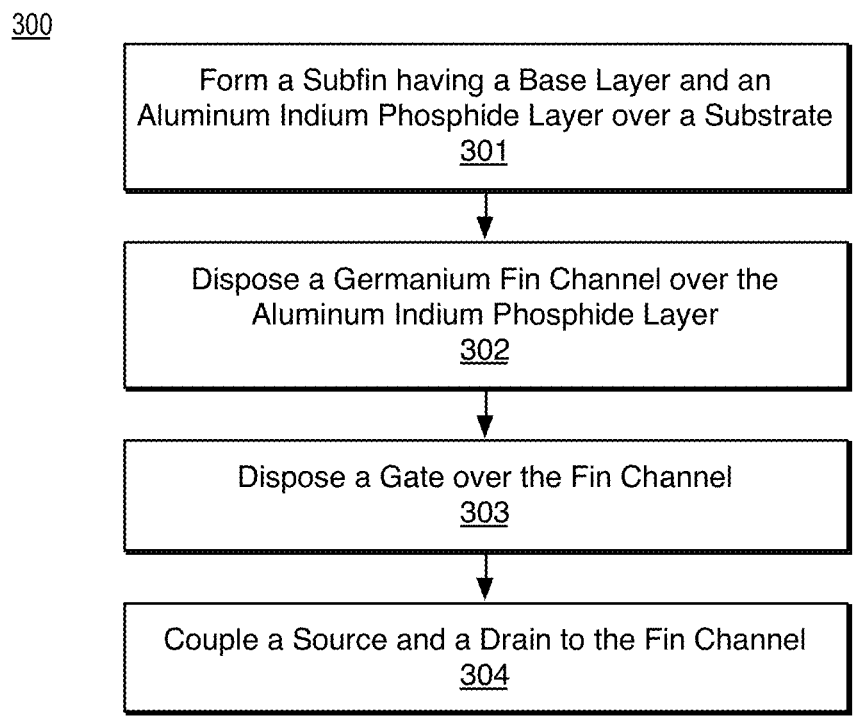
FIG. 3 is a flow diagram illustrating an example process for forming transistors having enhanced channel mobility and reduced leakage.

FIG. 3 is a flow diagram illustrating an example process 300 for forming transistors having enhanced channel mobility and reduced leakage, arranged in accordance with at least some implementations of the present disclosure. For example, process 300 may be implemented to fabricate transistor 120 and/or transistor 130 as discussed herein. In the illustrated implementation, process 300 may include one or more operations as illustrated by operations 301-304. However, embodiments herein may include additional operations, certain operations being omitted, or operations being performed out of the order provided.

Process 300 may begin at operation 301, "Form a Subfin having a Base Layer and an Aluminum Indium Phosphide Layer over a Substrate", where a subfin having a base layer and an aluminum indium phosphide layer over the base layer may be formed over or on a substrate. For example, the base layer may be a first layer and the aluminum indium phosphide layer may be a second layer or subfin layer as discussed herein. In an embodiment, subfin 122 and/or subfin 132 may be formed over substrate 101 as discussed further herein with respect to FIGS. 4A-4F and elsewhere herein. In an embodiment, subfins 122, 132 may include the same or substantially the same materials and subfins 122, 132 may be formed together. In another embodiment, subfins 122, 132 may include different materials (e.g., different concentrations of aluminum in their aluminum indium phosphide layer) and subfins 122, 132 may be formed separately as is discussed further herein. In an embodiment, the subfins may be formed in a trench via epitaxial growth techniques.

Process 300 may continue at operation 302, "Dispose a Germanium Fin Channel over the Aluminum Indium Phosphide Layer", where a fin channel comprising germanium may be disposed over the aluminum indium phosphide layer of the subfin. In an embodiment, fin channel 121 and/or fin channel 131 may be disposed over subfin 122 and/or subfin 132, respectively, as discussed further herein with respect to FIGS. 4E-4G and elsewhere herein. In an embodiment, fin channel 121 and/or fin channel 131 may be deposited over subfin 122 and/or subfin 132. In an embodiment, fin channels 121, 131, may include the same or substantially the same materials and fin channels 121, 131 may be formed together. In another embodiment, fin channels 121, 131 may include different materials and fin channels 121, 131 may be formed separately as is discussed further herein. In an embodiment, the fin channels may be formed in a trench via epitaxial growth techniques.

Process 300 may continue at operation 303, "Dispose a Gate over the Fin Channel", where a gate may be disposed over the fin channel In an embodiment, gate 107 and/or gate 108 may be formed over a channel region of fin channel 121 and/or a channel region of fin channel 131, respectively. For example, gate 107 and/or gate 108 may include an epitaxial layer of silicon or other suitable material adjacent to channel regions of fin channels 121, 131 a high-k gate dielectric over the epitaxial layer of silicon and a metal gate portion over the high-k gate dielectric. For example, the gates may be formed via epitaxial growth techniques and/or blanket deposition techniques and patterning techniques or the like.

Process 300 may continue at operation 304, "Couple a Source and a Drain to the Fin", where a source and a drain may be coupled to the fin channel In an embodiment, source 109 and drain 110 may be coupled to fin channel 121 and/or source 111 and drain 112 may be coupled to fin channel 131. As discussed, fin channels 121, 131 may include channel regions that provide channels in operation. Furthermore, fin channels 121, 131 may include source/drain contact regions for contacting a source and drain. For example, the sources and drains may be formed via masking and epitaxial growth techniques or via blanket deposition and patterning techniques or the like.

As discussed, process 300 may be implemented to fabricate transistor 120 and/or transistor 130. Further details associated with such fabrication techniques are discussed herein an in particular, with respect to FIGS. 4A-4G. Any one or more of the operations of process 300 (or the operations discussed herein with respect to FIGS. 4A-4G) may be undertaken in response to instructions provided by one or more computer program products. Such program products may include signal bearing media providing instructions that, when executed by, for example, a processor, may provide the functionality described herein. The computer program products may be provided in any form of computer readable medium. Thus, for example, a processor including one or more processor core(s) may undertake one or more of the described operations in response to instructions conveyed to the processor by a computer readable medium.

Figure 4A:
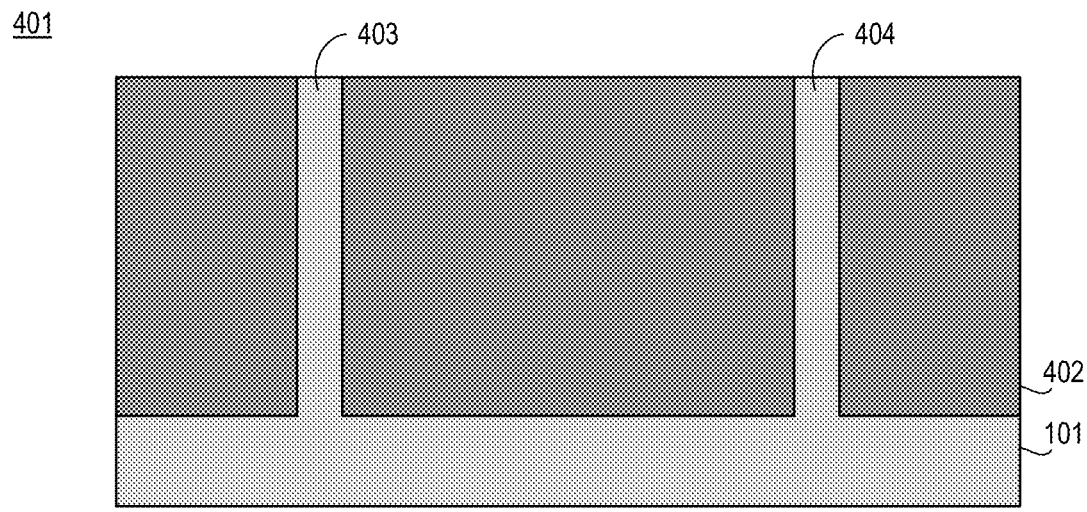
FIGS. 4A, 4B, 4C, 4D, 4E, 4F, and 4G are side views of example transistor structures as particular fabrication operations are performed.

FIGS. 4A-4G are side views of example transistor structures as particular fabrication operations are performed, arranged in accordance with at least some implementations of the present disclosure. FIG. 4A illustrates a side view of transistor structure 401 taken along plane A as shown in the plan view of FIG. 1B. As shown in FIG. 4A, transistor structure 401 includes substrate 101, sacrificial fins 403, 404, and dielectric layer 402. For example, substrate 101 may be a substrate substantially aligned along a predetermined crystal orientation (e.g., (100), (111), (110), or the like). In some examples, substrate 101 may include a semiconductor material such as monocrystalline silicon (Si), germanium (Ge), silicon germanium (SiGe), a III-V materials based material (e.g., gallium arsenide (GaAs)), a silicon carbide (SiC), a sapphire ($Al_2O_3$), or any combination thereof. In an embodiment, substrate 101 may include silicon having a (100) crystal orientation. In various examples, substrate 101 may include metallization interconnect layers for integrated circuits or electronic devices such as transistors, memories, capacitors, resistors, optoelectronic devices, switches, or any other active or passive electronic devices separated by an electrically insulating layer, for example, an interlayer dielectric, a trench insulation layer, or the like.

Also as shown in FIG. 4A, sacrificial fins 403, 404 and a dielectric layer 402 may be formed over substrate 101 such that sacrificial fins 403, 404 are adjacent to dielectric layer 402. For example, sacrificial fins 403, 404 may be formed via a patterning and etch of substrate 101 as illustrated (e.g., sacrificial fins 403, 404 may comprise crystalline silicon) or via a material deposition and patterning of the material (e.g., polysilicon or the like). The size and shape of sacrificial fins 403, 404 may define subsequent openings that may, in turn, define the size and shape of subfins 122, 132 and fin channels 121, 131, which may be formed in trenches formed when sacrificial fins 403, 404 are removed. In an embodiment, sacrificial fins 403, 404 may have substantially vertical sidewalls as shown. In an embodiment, sacrificial fins 403, 404 may have angled sidewalls such that the bottoms of sacrificial fins 403, 404 may be wider than the tops of sacrificial fins 403, 404. In another embodiment, the sidewalls of sacrificial fins 403, 404 may each have a curved shape such that the bottoms of sacrificial fins 403, 404 may wider than the tops of sacrificial fins 403, 404 and such that the sidewalls have a concave curved shape. Additional details associated with sacrificial fins 403, 404 are discussed further herein with respect to the trenches they form.

Dielectric layer 402 may include any material that may be selectively etched with respect to sacrificial fins 403, 404 and that may allow selective epitaxial growth from substrate 101 (e.g., without epitaxial growth from dielectric layer 402). Dielectric layer 402 may be formed in any suitable manner such as bulk deposition or thermal growth and planarization techniques or the like. In an embodiment, dielectric layer 402 is a silicon oxide. In some embodiments, dielectric layer 402 may include silicon nitride, silicon oxynitride, aluminum oxide, or the like. For example, dielectric layer 402 may deposited using a blanket deposition techniques such as chemical vapor deposition (CVD), plasma Enhanced chemical vapor deposition (PECVD), physical vapor deposition (PVD), molecular beam epitaxy (MBE), metalorganic chemical vapor deposition (MOCVD), atomic layer deposition (ALD), or the like, and a planar technique such as chemical mechanical polishing techniques may be used to expose sacrificial fins 403, 404.

Figure 4B:
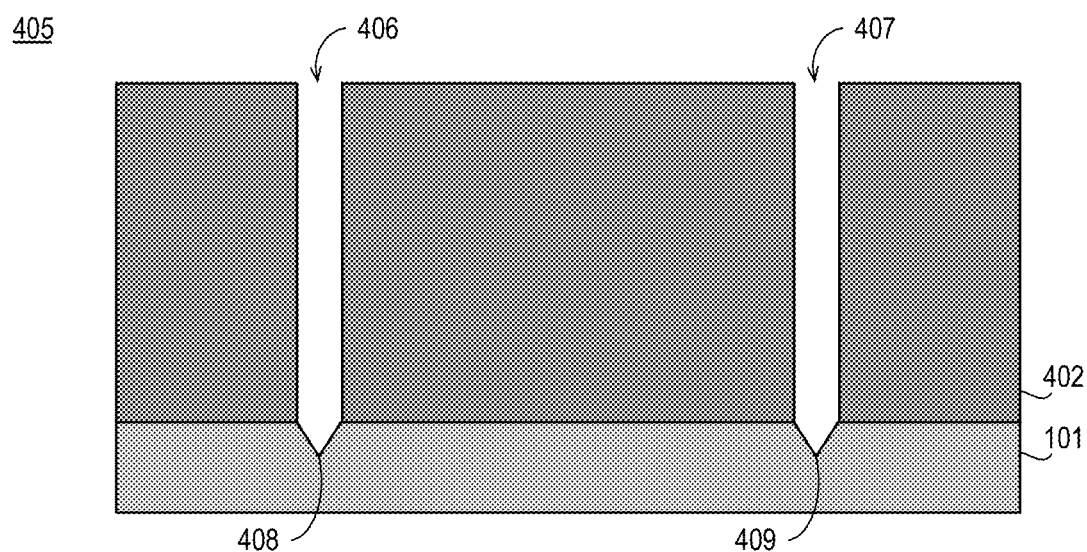

FIG. 4B illustrates a transistor structure 405 similar to transistor structure 401, after the removal of sacrificial fins 403, 404 to form trenches 406, 407. Sacrificial fins 403, 404 may be removed using any suitable technique such as an etch operation. As discussed, the size and shape of sacrificial fin 403, 404 may define the size and shape of trenches 406, 407. In various embodiments, trenches 406, 407 may have substantially vertical sidewalls, sloped sidewalls, or sloped and concave sidewalls, or the like. Trenches 406, 407 may include width and heights. In some embodiments, the widths may be in the range of 8 to 20 nm. In some embodiments, the heights may be in the range of 200 to 350 nm.

Furthermore, facets 408, 409 may be formed in substrate 101 as part of forming trenches 406, 407. For example, facets 408, 409 may support or aid the subsequent epitaxial growth of materials within trenches 406, 407. In an embodiment, facets 408, 409 may be (111) facets in a silicon substrate 101. In some embodiments, facets 408, 409 may not be formed in substrate 101.

Figure 4C:
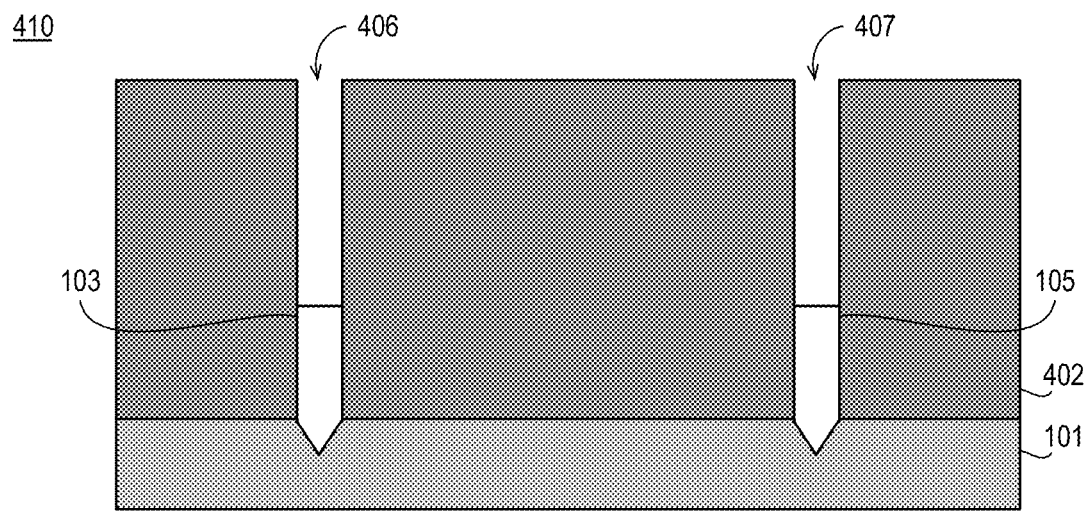

FIG. 4C illustrates a transistor structure 410 similar to transistor structure 405, after the formation of base layers 103, 105. Base layers 103, 105 may be formed, for example, via any suitable epitaxial growth technique such as, for example, an epitaxial growth via chemical vapor deposition, metal organic chemical vapor deposition, atomic layer deposition, or any other epitaxial growth technique. Base layers 103, 105 may include any suitable epitaxial layer materials. For example, base layers 103, 105 may bridge any lattice mismatch between substrate 101 and subsequent subfin layers. In an embodiment, base layers 103, 105 comprises gallium arsenide. Base layers 103, 105 may have any suitable height such as a height in the range of about 50 to 120 nm.

Figure 4D:
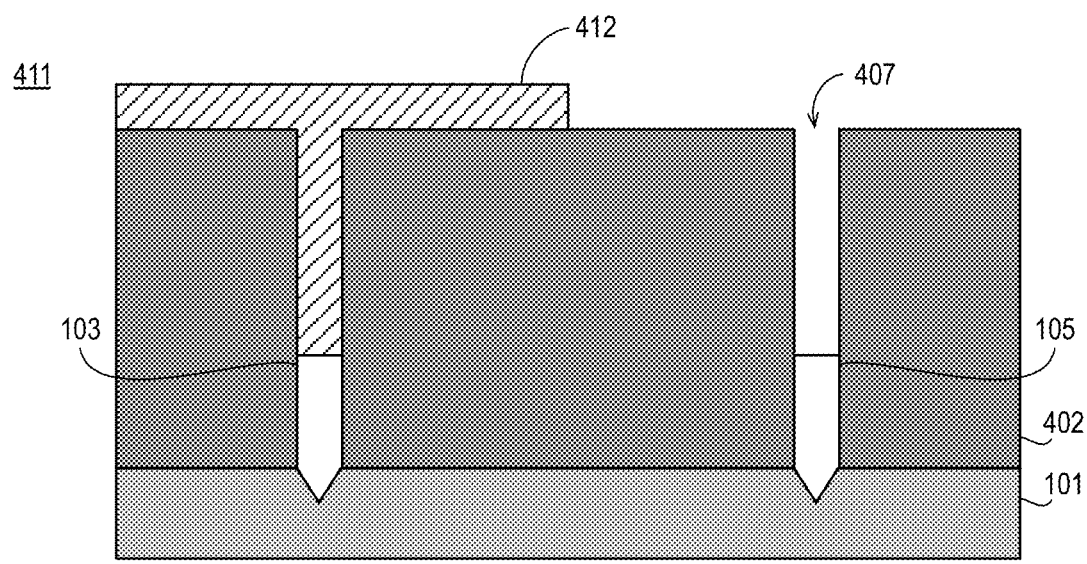

FIG. 4D illustrates a transistor structure 411 similar to transistor structure 410, after the formation of mask 412. Mask 412 may be formed using any suitable technique or techniques such as photolithography techniques. In some embodiments, mask 412 may include a hardmask material (e.g., silicon oxide, silicon nitride, silicon oxynitride, aluminum oxide, or the like). Mask 412 may be any material that provides epitaxial growth selectivity with respect to base layer 105.

As discussed herein, in some embodiments, subfin layers 104, 105 may have different material compositions or different materials and/or fin channels 121, 131 may have different material compositions or different materials. To form such devices, mask 412 may be provided such that one subfin layer and fin channel may be formed in one trench (e.g., for an NMOS or a PMOS transistor) while another is masked. Subsequently, the mask may be removed and the other subfin layer and the other fin channel may be formed in the now exposed trench (e.g., for the other type of transistor). The process flow illustrated via FIGS. 4A-4G may provide for NMOS and PMOS transistors having the same base layers and may provide for different subfin layer and fin channel materials. However, in an embodiment, the NMOS and PMOS transistors may have the same subfin layers and such subfin layers may be formed without masking (e.g., simultaneously). In another embodiment, the NMOS and PMOS transistors may have different base layers and masking may be performed prior to the formation of such base layers. Furthermore, the process flow illustrated via FIGS. 4A-4G illustrates portions of a PMOS transistor being formed prior to the formation portions of an NMOS transistor. In some embodiments, portions of an NMOS transistor may be formed prior to the formation of portions of a PMOS transistor.

Figure 4E:
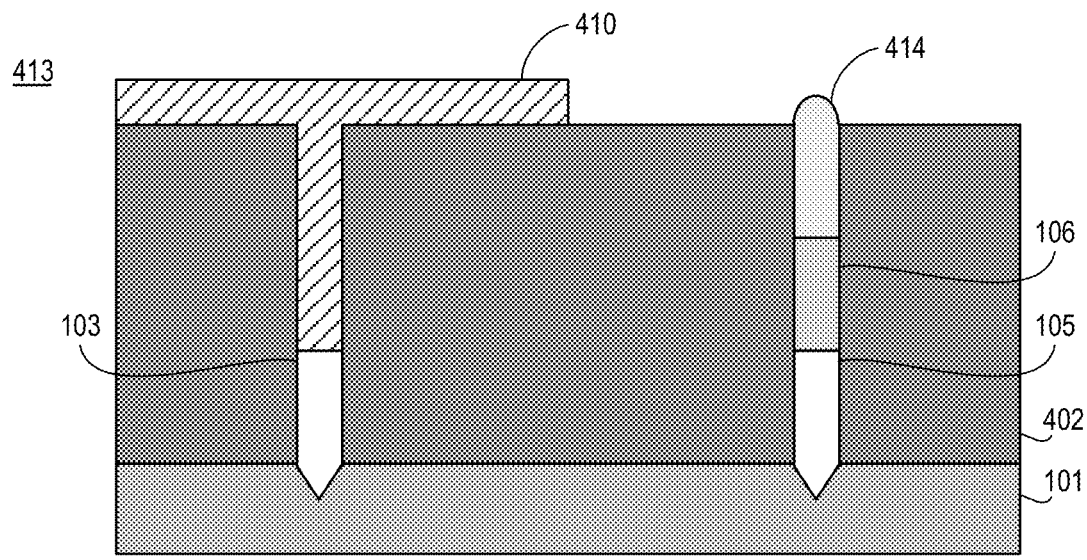

FIG. 4E illustrates a transistor structure 413 similar to transistor structure 411, after the formation of subfin layer 106 and fin channel 414. Subfin layer 106 may be formed via any suitable epitaxial growth technique such as, for example, an epitaxial growth via chemical vapor deposition, metal organic chemical vapor deposition, atomic layer deposition, or any other epitaxial growth technique. In an embodiment, subfin layer 106 comprises aluminum indium phosphide. In an embodiment, subfin layer 106 comprises aluminum indium phosphide having a concentration of aluminum selected as described herein to provide a compressive strain on fin channel 414 (and subsequently formed fin channel 131). Subfin layer 106 may have any suitable height such as a height in the range of about 50 to 120 nm.

Fin channel 414 may be formed, for example, via any suitable epitaxial growth technique such as, for example, an epitaxial growth via chemical vapor deposition, metal organic chemical vapor deposition, atomic layer deposition, or any other epitaxial growth technique. In an embodiment, fin channel 414 comprises germanium as discussed herein. As shown, fin channel 414 may have an overgrowth portion that extends above dielectric layer 402. Such an overgrowth portion may be subsequently removed. Fin channel 414 (after removal of such an overgrowth portion) may have any suitable height such as a height in the range of about 50 to 120 nm. Also, as discussed, base layer 105, subfin layer 106, and fin channel 414 may have any suitable widths such as widths in the range of 8 to 20 nm.

Figure 4F:
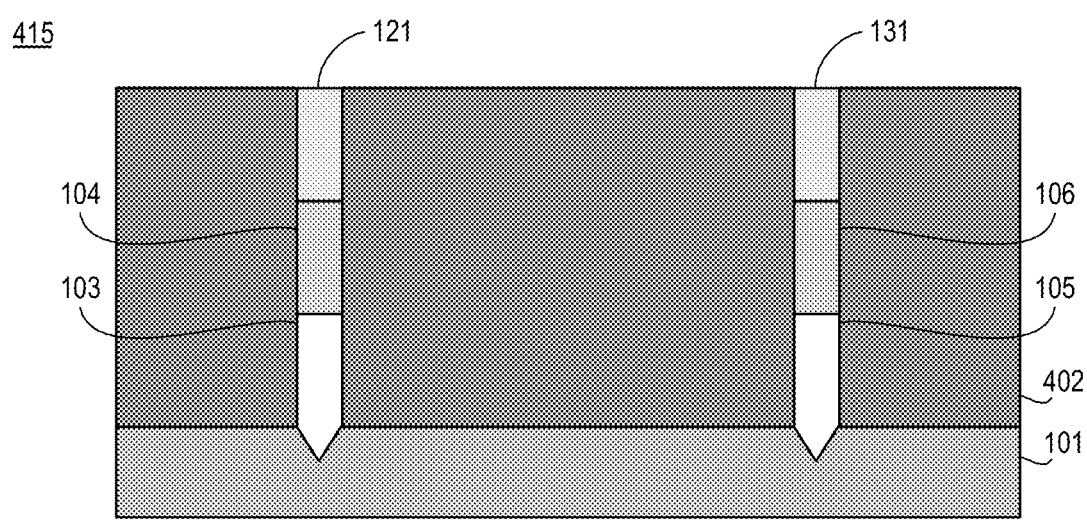

FIG. 4F illustrates a transistor structure 415 similar to transistor structure 413, after the removal of mask 412 and the formation of fin channel 131, subfin layer 104, and fin channel 121. For example, mask layer 412 may be removed using any suitable technique or techniques such as an etch (e.g., a dry or wet etch) or the like. Subfin layer 104 may be formed via any suitable epitaxial growth technique such as, for example, an epitaxial growth via chemical vapor deposition, metal organic chemical vapor deposition, atomic layer deposition, or any other epitaxial growth technique. In an embodiment, subfin layer 104 comprises aluminum indium phosphide. In an embodiment, subfin layer 104 comprises aluminum indium phosphide having a concentration of aluminum selected as described herein to provide a tensile strain on fin channel 121. Subfin layer 106 may have any suitable height such as a height in the range of about 50 to 120 nm. In some embodiments, subfin layers 106, 104 may have the same or substantially the same heights and, in other embodiments, their heights may be different.

Fin channel 121 may be formed, for example, via any suitable epitaxial growth technique such as, for example, an epitaxial growth via chemical vapor deposition, metal organic chemical vapor deposition, atomic layer deposition, or any other epitaxial growth technique. In an embodiment, fin channel 121 comprises germanium as discussed herein. In an embodiment, the formation of fin channel 121 may provide an overgrowth portion analogous to the overgrowth portion of fin channel 414 (please refer to FIG. 4E). Furthermore, the formation subfin layer 104 and fin channel 121 may include masking fin channel 414 (and subsequent mask removal) or not. In embodiments that do not include such masking, additional overgrowths of the materials of subfin layer 104 and fin channel 121 may grow from fin channel 414 and over dielectric layer 402. In any event, such overgrowth portions may be removed by a planarization operation or the like to form fin channels 121, 131 as illustrated in FIG. 4F. Fin channel 121 may have any suitable height such as a height in the range of about 50 to 120 nm. In some embodiments, fin channels 121, 131 may have the same or substantially the same heights and, in other embodiments, their heights may be different. Also, as discussed, base layer 103, subfin layer 104, and fin channel 121 may have any suitable widths such as widths in the range of 8 to 20 nm.

Figure 4G:
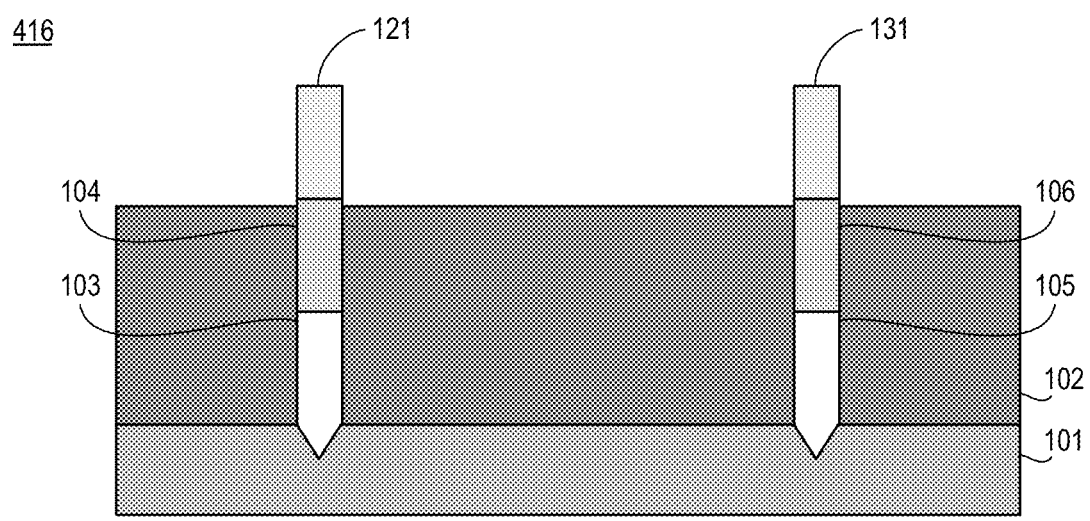

FIG. 4G illustrates a transistor structure 416 similar to transistor structure 415, after recessing dielectric layer 402 to form dielectric layer 102. As shown in FIG. 4G, in an embodiment, dielectric layer 402 may be recessed such that a top surface of dielectric layer 102 is below the bottom surfaces of fin channels 121, 131 and above the top surfaces of subfin layers 104, 105. Dielectric layer 402 may be recessed using any suitable technique or techniques such as etch operations, timed etch operations, or the like.

As discussed with respect to process 300 and FIGS. 1A and 1B, gates, sources, and drains may be formed. Such gates, sources, and drains may be formed using any suitable technique or techniques. For example, gates may be formed using deposition techniques (e.g., conformal or bulk depositions) and patterning techniques (e.g., photolithography and etch techniques). Furthermore, sources and drains may be formed by selective growth of epitaxial sources and drains, by bulk deposition and patterning techniques, or the like.

FIGS. 4A-4G illustrate an example process flow for fabricating transistor 120 and transistor 130 as discussed herein. In various examples, additional operations may be included or certain operations may be omitted. In particular, the illustrated process may provide for transistors with subfin layers and fin channels having different material compositions. As discussed, some operations may be omitted and/or modified to fabricate transistors having subfin layers and/or fin channels with the same material compositions or transistors with base layers having different material compositions, or the like.

Figure 5:
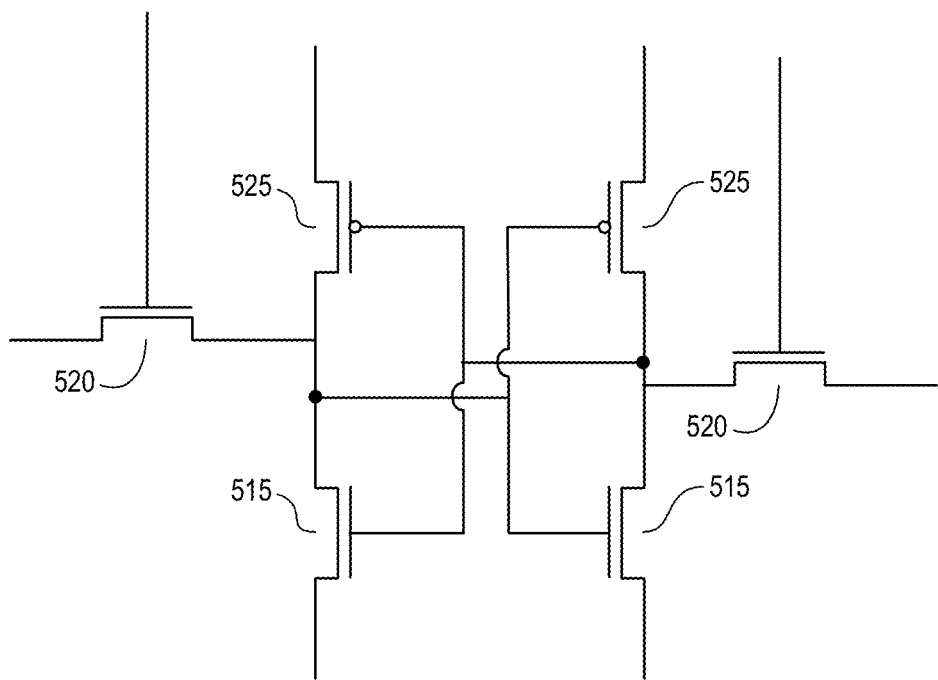
FIG. 5 is a view of an example SRAM cell implementing one or more transistors having enhanced channel mobility and reduced leakage.

FIG. 5 is a view of an example SRAM cell 500 implementing one or more transistors having enhanced channel mobility and reduced leakage, arranged in accordance with at least some implementations of the present disclosure. FIG. 5 illustrates an example 6 transistor (6T) SRAM cell 500 including access transistors 520, pull-down transistors 515, and pull-up transistors 525. In various examples, access transistors 520, pull-down transistors 515, and pull-up transistors 525 may be implemented as transistor 120 and/or 130. A complete SRAM memory circuit may be formed by interconnecting many SRAM cells such as SRAM cell 500.

In an embodiment, one or more of access transistors 520 and pull-down transistors 515 are NMOS transistors and may include features discussed with respect to NMOS transistors herein and pull-up transistors 525 are PMOS transistors and may include features discussed with respect to NMOS transistors discussed herein. In an embodiment, access transistors 520 may include fin channel 121 comprising germanium, subfin layer 104 comprising aluminum indium phosphide adjacent to fin channel 121, and base layer 103 adjacent to subfin layer 104. In an embodiment, subfin layer 104 comprises gallium arsenide. Furthermore, in some embodiments, pull-down transistors 515 may include fin channel 131, subfin layer 106 adjacent to fin channel 131, and base layer 105 adjacent to subfin layer 106. In an embodiment, pull-down transistors 515 include fin channel 131 comprising germanium, subfin layer 106 comprising aluminum indium phosphide adjacent to fin channel 131, and base layer 105 comprising gallium arsenide adjacent to subfin layer 106. In an embodiment, subfin layer 106 may comprise an aluminum to indium ratio greater than the aluminum to indium ratio of subfin layer 104. As discussed, such material suggestions may provide stress engineering to optimize the performance of pull-down transistors 515 and pull-up transistors 525.

Figure 6:
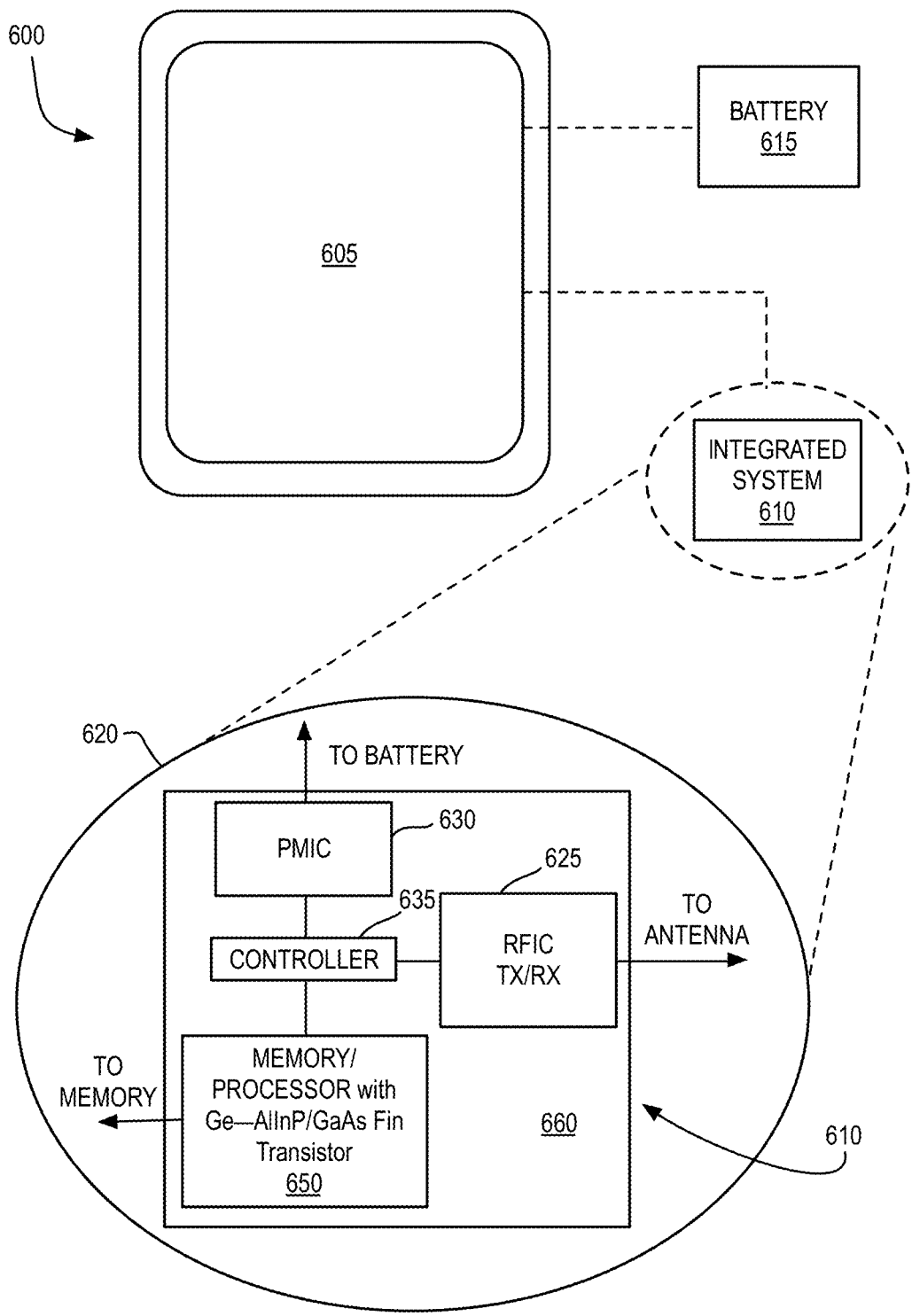
FIG. 6 is an illustrative diagram of a mobile computing platform employing an integrated circuit with transistor(s) having germanium fin channels and aluminum indium phosphide subfin layers.

FIG. 6 is an illustrative diagram of a mobile computing platform 600 employing an IC with transistor(s) having germanium fin channels and aluminum indium phosphide subfin layers, arranged in accordance with at least some implementations of the present disclosure. A transistor or transistors having germanium fin channels and aluminum indium phosphide subfin layers may be any transistors as discussed herein such as transistor 120 or transistor 130 or the like. In some examples, NMOS and PMOS transistors as discussed herein may be implemented together as a CMOS circuit. Mobile computing platform 600 may be any portable device configured for each of electronic data display, electronic data processing, wireless electronic data transmission, or the like. For example, mobile computing platform 600 may be any of a tablet, a smart phone, a netbook, a laptop computer, etc. and may include a display screen 605, which in the exemplary embodiment is a touchscreen (e.g., capacitive, inductive, resistive, etc. touchscreen), a chip-level (SoC) or package-level integrated system 610, and a battery 615.

Integrated system 610 is further illustrated in the expanded view 620. In the exemplary embodiment, packaged device 650 (labeled "Memory/Processor" in FIG. 6) includes at least one memory chip (e.g., RAM), and/or at least one processor chip (e.g., a microprocessor, a multi-core microprocessor, or graphics processor, or the like). In an embodiment, package device 650 is a microprocessor including an SRAM cache memory. In an embodiment, package device 650 includes one or more of transistor 120 or transistor 130 or both. For example, an employed transistor may include a germanium fin channel and an aluminum indium phosphide subfin layer adjacent to the germanium fin channel. Packaged device 650 may be further coupled to (e.g., communicatively coupled to) a board, a substrate, or an interposer 660 along with, one or more of a power management integrated circuit (PMIC) 630, RF (wireless) integrated circuit (RFIC) 625 including a wideband RF (wireless) transmitter and/or receiver (TX/RX) (e.g., including a digital baseband and an analog front end module further comprises a power amplifier on a transmit path and a low noise amplifier on a receive path), and a controller thereof 635. In general, packaged device 650 may be also be coupled to (e.g., communicatively coupled to) display screen 605.

Functionally, PMIC 630 may perform battery power regulation, DC-to-DC conversion, etc., and so has an input coupled to battery 615 and with an output providing a current supply to other functional modules. In an embodiment, PMIC 630 may perform high voltage operations. As further illustrated, in the exemplary embodiment, RFIC 625 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of packaged device 650 or within a single IC (SoC) coupled to the package substrate of the packaged device 650.

Figure 7:
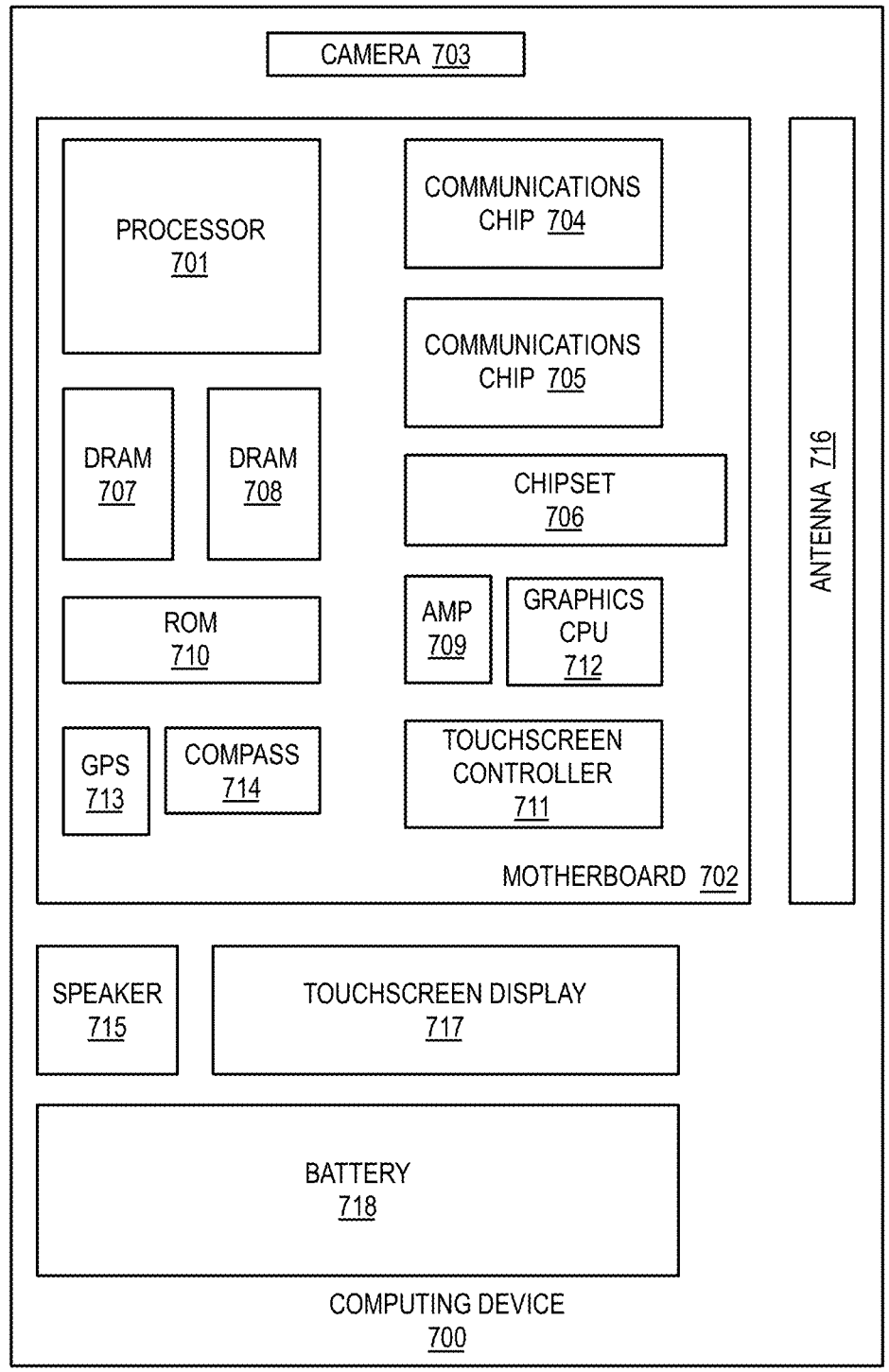
FIG. 7 is a functional block diagram of a computing device, all arranged in accordance with at least some implementations of the present disclosure.

FIG. 7 is a functional block diagram of a computing device 700, arranged in accordance with at least some implementations of the present disclosure. Computing device 700 may be found inside platform 600, for example, and further includes a motherboard 702 hosting a number of components, such as but not limited to a processor 701 (e.g., an applications processor) and one or more communications chips 704, 705. Processor 701 may be physically and/or electrically coupled to motherboard 702. In some examples, processor 701 includes an integrated circuit die packaged within the processor 701. In general, the term "processor" may refer to any device or portion of a device that processes electronic data from registers and/or memory to transform that electronic data into other electronic data that may be stored in registers and/or memory.

In various examples, one or more communication chips 704, 705 may also be physically and/or electrically coupled to the motherboard 702. In further implementations, communication chips 704 may be part of processor 701. Depending on its applications, computing device 700 may include other components that may or may not be physically and electrically coupled to motherboard 702. These other components may include, but are not limited to, volatile memory (e.g., DRAM) 707, 708, non-volatile memory (e.g., ROM) 710, a graphics processor 712, flash memory, global positioning system (GPS) device 713, compass 714, a chipset 706, an antenna 716, a power amplifier 709, a touchscreen controller 711, a touchscreen display 717, a speaker 715, a camera 703, and a battery 718, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like.

Communication chips 704, 705 may enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 704, 705 may implement any of a number of wireless standards or protocols, including but not limited to those described elsewhere herein. As discussed, computing device 700 may include a plurality of communication chips 704, 705. For example, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

As used in any implementation described herein, the term "module" refers to any combination of software, firmware and/or hardware configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, and/or firmware that stores instructions executed by programmable circuitry. The modules may, collectively or individually, be embodied as circuitry that forms part of a larger system, for example, an integrated circuit (IC), system on-chip (SoC), and so forth.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

The following examples pertain to further embodiments.

In one or more first embodiments, an integrated circuit comprises a transistor including a fin channel comprising germanium and a subfin having a first layer adjacent to the fin channel and a second layer adjacent to the first layer, wherein the first layer comprises aluminum indium phosphide.

Further to the first embodiments, the integrated circuit further comprises a second transistor including a second fin channel and a second subfin having a third layer adjacent to the fin channel and a fourth layer adjacent to the first layer, wherein the transistor is a PMOS transistor and the second transistor is an NMOS transistor.

Further to the first embodiments, the integrated circuit further comprises a second transistor including a second fin channel and a second subfin having a third layer adjacent to the fin channel and a fourth layer adjacent to the first layer, wherein the transistor is a PMOS transistor and the second transistor is an NMOS transistor and the third layer comprises aluminum indium phosphide having the same composition as the first layer.

Further to the first embodiments, the integrated circuit further comprises a second transistor including a second fin channel and a second subfin having a third layer adjacent to the fin channel and a fourth layer adjacent to the first layer, wherein the transistor is a PMOS transistor and the second transistor is an NMOS transistor, the second fin channel comprises germanium, the first layer comprises a first aluminum to indium ratio, and the third layer comprises aluminum indium phosphide having a second aluminum to indium ratio less than the first aluminum to indium ratio.

Further to the first embodiments, the integrated circuit further comprises a second transistor including a second fin channel and a second subfin having a third layer adjacent to the fin channel and a fourth layer adjacent to the first layer, wherein the transistor is a PMOS transistor and the second transistor is an NMOS transistor and the second fin channel comprises indium gallium arsenide and the third layer comprises gallium arsenide.

Further to the first embodiments, the second layer comprises gallium arsenide.

Further to the first embodiments, the integrated circuit further comprises a dielectric layer adjacent to the second layer and a first portion of the first layer, wherein a second portion of the first layer extends beyond a top surface of the dielectric layer, and a substrate, wherein the first layer and the dielectric layer are on the substrate.

Further to the first embodiments, the second layer comprises gallium arsenide and/or the integrated circuit further comprises a dielectric layer adjacent to the second layer and a first portion of the first layer, wherein a second portion of the first layer extends beyond a top surface of the dielectric layer, and a substrate, wherein the first layer and the dielectric layer are on the substrate.

Further to the first embodiments, the transistor is a PMOS transistor and the first layer comprises aluminum indium phosphide having an aluminum concentration in the range of 100% to 50%.

Further to the first embodiments, the transistor is an NMOS transistor and the first layer comprises aluminum indium phosphide having an aluminum concentration in the range of 35% to 50%.

In one or more second embodiments, an SRAM cell comprises an NMOS transistor including a fin channel comprising germanium and a subfin having a first layer adjacent to the fin channel and a second layer adjacent to the first layer, wherein the first layer comprises aluminum indium phosphide, and a PMOS transistor including a second fin channel and a second subfin having a third layer adjacent to the fin channel and a fourth layer adjacent to the first layer.

Further to the second embodiments, the second fin channel comprises germanium, the first layer comprises a first aluminum to indium ratio, and the third layer comprises aluminum indium phosphide having a second aluminum to indium ratio greater than the first aluminum to indium ratio.

Further to the second embodiments, the second fin channel comprises at least one of germanium, silicon, or a III-V material.

Further to the second embodiments, the second layer comprises gallium arsenide.

Further to the second embodiments, the SRAM cell further comprises an insulator layer adjacent to the second layer and a first portion of the first layer, wherein a second portion of the first layer extends beyond the insulator layer, and a substrate, wherein the first layer and the insulator are on the substrate.

Further to the second embodiments, the second fin channel comprises at least one of germanium, silicon, or a III-V material and/or the second layer comprises gallium arsenide and/or the SRAM cell further comprises an insulator layer adjacent to the second layer and a first portion of the first layer, wherein a second portion of the first layer extends beyond the insulator layer, and a substrate, wherein the first layer and the insulator are on the substrate.

In one or more third embodiments, a method for fabricating an integrated circuit comprises forming a subfin having a first layer over a substrate and a second layer over the first layer, wherein the second layer comprises aluminum indium phosphide and disposing a fin channel comprising germanium over the second layer of the subfin.

Further to the third embodiments, forming the subfin and disposing the fin channel comprises forming a trench in a dielectric layer, epitaxially growing the first layer, epitaxially growing the second layer, epitaxially growing the fin channel, and recessing the dielectric layer such that a top surface of the dielectric layer is below a top surface of the second layer.

Further to the third embodiments, the method further comprises forming a second subfin having a third layer over the substrate and a fourth layer over the third layer and disposing a second fin channel comprising germanium over the fourth layer, wherein the fourth layer comprises aluminum indium phosphide having a different aluminum concentration than the second layer.

Further to the third embodiments, the method further comprises forming a second subfin and disposing a second fin channel comprising at least one of germanium, silicon, or a III-V material over the second subfin.

Further to the third embodiments, the first layer comprises gallium arsenide.

Further to the third embodiments, the method further comprises forming a second subfin having a third layer over the substrate and a fourth layer over the third layer and disposing a second fin comprising germanium over the fourth layer, wherein the fourth layer comprises aluminum indium phosphide having a different aluminum concentration than the second layer, and wherein forming the second subfin and disposing the second fin channel comprises forming a first sacrificial fin and a second sacrificial fin each adjacent to a dielectric layer, removing the first and second sacrificial fins to form a first trench and a second trench, epitaxially growing the first layer within the first trench and the third layer within the second trench, masking the first layer and the first trench, epitaxially growing the fourth layer within the second trench, and epitaxially growing the second fin within the second trench.

In one or more fourth embodiments, a mobile computing platform comprises any of the example structures discussed with respect to the first or second embodiments.

It will be recognized that the invention is not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An integrated circuit comprising a transistor comprising:
   a fin channel comprising germanium; and
   a subfin having a first layer adjacent to the fin channel and a second layer adjacent to the first layer, wherein the first layer comprises aluminum, indium, and phosphorus.

2. The integrated circuit of claim 1, further comprising a second transistor comprising:
   a second fin channel; and
   a second subfin having a third layer adjacent to the second fin channel and a fourth layer adjacent to the third layer, wherein the transistor is a PMOS transistor and the second transistor is an NMOS transistor.

3. The integrated circuit of claim 2, wherein the third layer comprises aluminum, indium, and phosphorus.

4. The integrated circuit of claim 2, wherein the second fin channel comprises germanium, the first layer comprises a first aluminum to indium ratio, and the third layer comprises aluminum, indium, and phosphorus having a second aluminum to indium ratio less than the first aluminum to indium ratio.

5. The integrated circuit of claim 2, wherein the second fin channel comprises indium, gallium, and arsenic, and the third layer comprises gallium and arsenic.

6. The integrated circuit of claim 1, wherein the second layer comprises gallium and arsenic.

7. The integrated circuit of claim 1 further comprising:
   a dielectric layer adjacent to the second layer and a first portion of the first layer, wherein a second portion of the first layer extends beyond a top surface of the dielectric layer; and
   a substrate, wherein the first layer and the dielectric layer are on the substrate.

8. The integrated circuit of claim 1, wherein the transistor is a PMOS transistor and the first layer comprises aluminum, indium, and phosphorus having an aluminum concentration in the range of 99% to 50%.

9. The integrated circuit of claim 1, wherein the transistor is an NMOS transistor and the first layer comprises aluminum, indium, and phosphorus having an aluminum concentration in the range of 35% to 50%.

10. A transistor structure comprising:
    a fin channel comprising germanium; and
    a subfin having a layer adjacent to the fin channel, the layer comprising aluminum, indium, and phosphorus.

11. The transistor structure of claim 10, wherein the transistor is a PMOS transistor and the layer comprises an aluminum concentration in the range of 99% to 50%.

12. The transistor structure of claim 10, wherein the transistor is an NMOS transistor and the layer comprises an aluminum concentration in the range of 35% to 50%.

13. The transistor structure of claim 10, further comprising:
    a dielectric layer adjacent to a first portion of the layer, wherein a second portion of the layer extends beyond a top surface of the dielectric layer.

14. The transistor structure of claim 10, wherein the subfin further comprises a second layer adjacent the layer.

15. The transistor structure of claim 14, wherein the second layer comprises gallium and arsenic.

16. An SRAM cell comprising:
    an NMOS transistor including:
      a first fin channel comprising germanium; and
      a first subfin having a first layer adjacent to the fin channel, wherein the first layer comprises aluminum, indium, and phosphorus; and
    a PMOS transistor including:
      a second fin channel; and
      a second subfin having a second layer adjacent to the fin channel.

17. The SRAM cell of claim 16, wherein the second fin channel comprises germanium, the first layer comprises a first aluminum to indium ratio, and the second layer comprises aluminum, indium, and phosphorus having a second aluminum to indium ratio greater than the first aluminum to indium ratio.

18. The SRAM cell of claim 16, wherein the second fin channel comprises at least one of germanium, silicon, or a III-V material.

19. The SRAM cell of claim 16, wherein the second layer comprises gallium and arsenic.

20. The SRAM cell of claim 16, further comprising:
    an insulator layer adjacent to the second layer and a first portion of the first layer, wherein a second portion of the first layer extends beyond the insulator layer; and
    a substrate, wherein the first layer and the insulator are on the substrate.

* * * * *